Feb. 4, 1969 J. G. F. BOUCHARD 3,426,254

TRANSISTORS AND METHOD OF MANUFACTURING THE SAME

Filed June 21, 1965 Sheet 1 of 2

INVENTOR:
Joseph G. F. Bouchard

BY Connolly and Hutz
ATTORNEYS

INVENTOR:
Joseph G. F. Bouchard

BY Connolly and Hutz
ATTORNEYS

United States Patent Office 3,426,254

Patented Feb. 4, 1969

3,426,254

TRANSISTORS AND METHOD OF MANUFACTURING THE SAME

Joseph G. F. Bouchard, Manchester, N.H., assignor to Sprague Electric Company, North Adams, Mass., a corporation of Massachusetts Filed June 21, 1965, Ser. No. 465,372

U.S. Cl. 317—235 17 Claims

Int. Cl. H01l *11/00, 3/00, 7/00*

ABSTRACT OF THE DISCLOSURE

The transistor includes an upper base region of low conductivity overlying a lower base region of high conductivity with an emitter disposed within the upper region in contact with the lower region so that base width and base density of the unit are substantially determined by the lower region and are not substantially dependent upon the emitter-base junction intercept. An isolating region of high resistivity and the conductivity of the collector and emitter is also employed around the base in contact with the perimeter of its upper region.

This invention relates to semiconductor devices, and more particularly to planar semiconductor devices and to a method of manufacturing the same.

Semiconductor devices produced by "planar" techniques are preferred in the present state of the art for their improved leakage characteristics. In transistors of this type, base and emitter regions are generally formed in a collector substrate by diffusion of impurities through openings in a protective oxide layer. Since the penetration of the diffusant is three dimensional, the junctions occur at the surface of the substrate beneath the oxide layer, whereby the junctions are maintained relatively free of contaminants.

A disadvantage of such construction, however, is that in order to provide high voltage breakdown and low capacitance, the collector of such devices is generally made of high resistivity material. Consequently, the diffused base region is enclosed at the surface by this high resistivity area which is easily influenced by surface conditions.

This is particularly troublesome in planar PNP transistors due to the surface conversion of high resistivity P-type material by the conventional masking coat of silicon dioxide. Such conversion results in an undesirable inversion layer of N-type conductivity at the transistor surface, which increases leakage current and the area of the collector-to-base junction.

Moreover, in conventional planar transistors, the impurity gradient of the diffused base region requires a compromise of device characteristics, since the impurity concentration of the emitter-base junction is directly related to the total base impurity density.

A low junction impurity concentration or low impurity profile intercept is desirable to provide a high emitter to base breakdown voltage ($BV_{EBO}$) and low emitter transition capacitance ($C_{TE}$) whereas a large total base impurity density is desirable to reduce extrinsic base resistance ($Rb'$) and increase punch through voltage ($Vpt$). Consequently, a low intercept is desirable to optimize the junction characteristics whereas a large base density is desirable to optimize the noted base characteristics. However, in diffused base transistors the reduction of the former adversly reduces the latter.

In conventional planar transistors, the desired low impurity concentration is achieved at the emitter base junction by allowing the emitter to penetrate to the low density portion of the base region, however, since such penetration is in a direction of decreasing base impurity density, the total base density is adversely reduced.

A further disadvantage of the prior art construction is that in monolithic microcircuits, high frequency devices having complementary characteristics can not be easily achieved. In monolithic microcircuits, the base of one device is generally, a substantially homogeneous region, whereas the base of a complementary device formed on the same substrate, is a diffused region of high density gradient. This results in, at best, a compromise of desired characteristics between the complementary devices.

It is an object of this invention to eleminate the foregoing disadvantages.

Another object of this invention is to provide a transsistor having low emitter junction density, narrow base width and large total base density.

Yet another object of this invention is to provide a transistor having a low resistivity isolating region in contact with the base region at the surface of the device.

Still another object of this invention is to provide a microcircuit having true complementary devices.

A further object of this invention is to provide a method of constructing a transistor wherein the emitter junction characteristics and base characteristics are independently determined.

A still further object of this invention is to provide a process for constructing a transistor having an isolating region enclosing and contacting the base region.

A still further object of this invention is to provide a process whereby true complementary transistors may be produced within the same substrate.

These and other objects will be apparent from the following description and drawing, in which.

Figure 1:
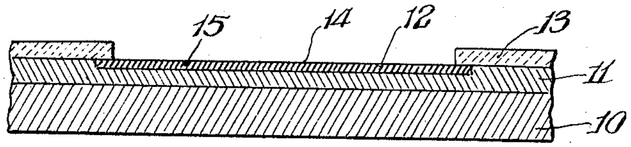
FIGURES 1–7 are views in section illustrative of the preferred method of fabricating a transistor according to this invention.

In its broadest scope, the invention provides a transistor comprising a collector of one conductivity type, a base of the other conductivity type having a narrow region of high conductivity contiguous with the collector and a substantially homogeneous region of low conductivity extending beyond the periphery of the narrow region, and at least one emitter of said one conductivity type within the homogeneous region.

Briefly, the process for forming a transistor in accordance with this invention comprises the steps of forming a collector of one conductivity type, forming a narrow base region of the other conductivity type within the collector, forming a substantially homogeneous base region having low conductivity and the same conductivity type as the narrow region overlying and extending beyond the periphery of the narrow region, and forming an emitter having the same conductivity type as the collector within the homogeneous region.

A preferred process for making a transistor, in accordance with this invention, comprises the steps of forming a semi-conductive collector wafer of high P-type conductivity, epitaxially growing a first semiconductive layer of low P-type conductivity overlying said wafer, diffusing a narrow region of a high N-type conductivity within the first layer at the upper surface thereof, epitaxially growing a second semiconductor layer of low N-type conductivity overlying the first layer, diffusing an isolating region of high P-type conductivity within the second layer at the periphery thereof to isolate a substantially homogeneous region of the second layer overlying the narrow region and extending beyond its periphery, diffusing an emitter region of high P-type conductivity within the homogeneous region and reducing the thickness of the wafer to allow only a thin area to remain.

The described process provides a preferred embodiment of a transistor, in accordance with this invention, comprising a first low conductivity P-type semiconductive layer overlying a thin high conductivity P-type semiconductive collector wafer, a narrow high conductivity N-type base region within the first layer near its upper surface, a second semiconductive layer overlying the first layer with a substantially homogeneous low conductivity N-type base region extending beyond the periphery of the narrow region, a peripheral high P-type isolating region enclosing the homogeneous region within the layer and contiguous with the perimeter of the homogeneous region, and a high conductivity P-type emitter within the homogeneous region.

Broadly, the invention also provides a microcircuit comprising a body of semiconductor material of one conductivity type having a plurality of spaced apart regions and overlying homogeneous regions of the other conductivity type, said homogeneous regions extending beyond the periphery of said spaced apart regions, a zone of said one conductivity type within each homogeneous region, and a portion of said other conductivity type within one of the zones.

A method of manufacturing a microcircuit in accordance with this invention comprises the steps of forming a semiconductor body of one conductivity type, forming a plurality of spaced apart regions of the other conductivity type within the body, forming a plurality of substantially homogeneous regions of said other conductivity type overlying the spaced apart regions and extending beyond their periphery, forming zones of said one conductivity type within each homogeneous region and forming a portion of said other conductivity type within one of said zones.

In the preferred process, the first step in the construction of a microcircuit in accordance with this invention is the forming of a substrate of semiconductor material having high P-type conductivity. Thereafter, a first semiconductive layer of low P-type conductivity is epitaxially grown over the substrate. Spaced apart regions of high N-type conductivity are then diffused into the upper surface of the first layer.

In the next step, a second semiconductive layer having low N-type conductivity is epitaxially grown over the first layer. Isolating regions of high conductivity are then diffused in the second layer to enclose a substantially homogeneous region adjacent each spaced apart region and extending beyond their periphery.

Thereafter, a zone of high P-type conductivity is diffused in each homogeneous region. Finally, a portion of high N-type conductivity is diffused in one of the zones.

Referring now to the drawing and in particular to FIGURE 1 thereof wherein is shown a semiconductive wafer 10 with an overlying semiconductive layer 11, a passivating coat 13, and a base region 15.

The structure of FIGURE 1 is produced, in the preferred embodiment, by first forming a P-type monocrystalline silicon substrate 10 of suitably high conductivity having, for example, an impurity concentration of approximately $10^{19}$ atoms/cm.$^3$. Thereafter, a monocrystalline silicon layer 11 of suitably low P-type conductivity, having for example an impurity concentration of approximately $10^{15}$ atoms/cm.$^3$, is grown over substrate 10 by suitable means. This is accomplished, for example, by epitaxial growth such as by hydrogen reduction of silicon tetrachloride at approximately 1250° C.

A passivating layer 13, of silicon dioxide or the like, is then formed on the surface of the structure by thermal oxidation or the like and a suitable opening 14 provided by suitable means such as etching.

Opening 14 is made to provide access to surface 12 for formation of the base region 15. This region 15 is formed of suitably high N-type conductivity by diffusion or the like. Thus, N-type impurities such as phosphorus, antimony, bismuth, or the like, are deposited on the exposed surface 12 and diffused into layer 11 by heating the structure at elevated temperatures. By this means, a narrow base 15 having a desired surface impurity concentration of approximately $10^{18}$ atoms/cm.$^3$ is formed.

Figure 2:
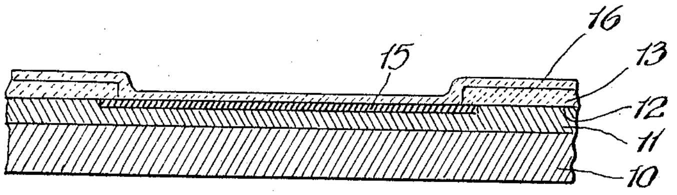

A second oxide coating 16, although not necessary to the invention, is grown for convenience over both the exposed portion of surface 12 and the initial oxide coating 13, as shown in FIGURE 2. This step is undertaken to provide an indication of the position of base region 15. As illustrated, region 15 is shown at the center of the top surface of the device and can be easily located; however, in many cases it may be desirable to position the highly doped base region 15, at other than the center of the surface, in which case its later location can be difficult.

The second oxide coating 16 overcomes this, in that once both oxides 15 and 16 have been stripped off, a surface depression will be provided in the area of opening 14 since this portion of surface 12 was oxidized at a higher rate, during the second oxidation step, than those portions which retained the original oxide coat 13.

Figure 3:
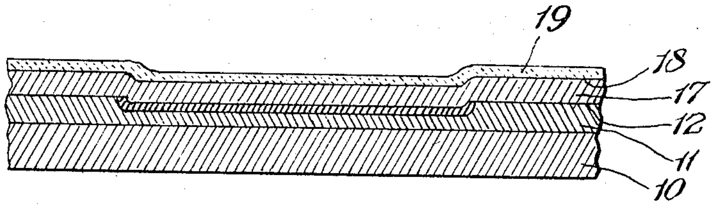

The surface depression is illustrated in FIGURE 3 underlying an additional layer 17, and further masking coat 19. The structure shown is formed by removing both coatings 13 and 16, by any suitable means such as etching or the like. Thereafter a second monocrystalline silicon layer 17 of low N-type conductivity is deposited by suitable means, for example, by epitaxial growth as previously described. Accordingly, a desired layer of low N-type conductivity, having a substantially homogeneous distribution of impurities and an impurity concentration of approximately $10^{15}$ atoms/cm.$^3$, is achieved.

Figure 4:
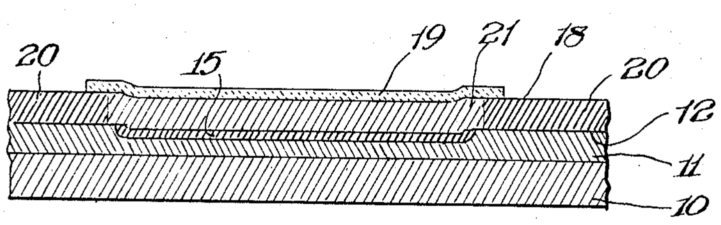

Again, a suitable masking coat 19 of silicon dioxide, or the like, is deposited on the structure. Thereafter, as shown in FIGURE 4, a portion of coating 19 is removed from the periphery of the device, by suitable means such as etching or the like, to provide an exposed portion of surface 18 while the remaining oxide covers an area exceeding that of base region 15. A high conductivity P-type region 20, having a surface impurity concentration of approximately $10^{20}$ atoms/cm.$^3$, is then formed in layer 17 by diffusion or the like. For example, P-type impurities such as boron, aluminum, indium or the like are deposited on the exposed periphery of surface 18 and the structure heated at elevated temperatures to form an isolating region 20 which encloses a base contact region 21.

Accordingly, the indicated base contact region 21, being the remaining part of layer 17, is a substantially homogeneous region of low N-type conductivity enclosed by a high P-type region 20. The homogeneous region 21 must extend beyond the periphery of the base region 15, as shown, to prevent contact of the high density base region 15 with the high density isolating region 20, so as to provide high collector-base breakdown voltage. It should be noted, that in this device the isolating region is contiguous or in contact with a homogeneous section of the transistor base.

The isolating region 20, by surrounding and contacting the base contact region 21, reduces collector leakage and collector capacitance, since it provides a P-type surface of high conductivity enclosing a low density base region 21 whose diameter only slightly exceeds that of the high density base region 15.

This is in contrast to the prior art where isolating regions are formed around a diffused base region. In such cases, in order to provide a sufficient collector-base breakdown voltage, a low collector-base junction density is maintained by allowing low resistivity material to remain between the isolating region and the base. Consequently, such devices fail to provide the low leakage and low collector capacitance desired.

Figure 5:
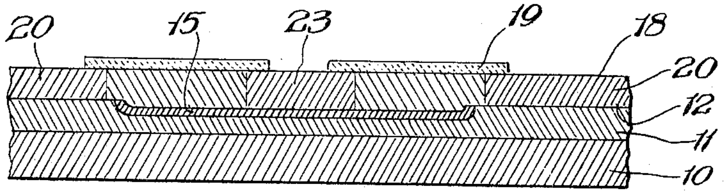

An emitter region 23, as shown in FIGURE 5, is formed by suitable means such as by diffusion of P-type impurities through a suitable further opening in the oxide coating 19. A desired high conductivity P-type region 23, with, for example, a surface impurity concentration of greater then $10^{20}$ atoms/cm.$^3$ may be formed by the method described for the isolating region 20. As indicated, the isolating region 20 is exposed during the diffusion of the emitter 23 so that its high surface concentration is maintained. Where emitter and isolating regions of different concentrations are desired a further oxide coat may de deposited before the emitter or second region is formed. Moreover, in some cases it may be desirable to form emitter region 23 simultaneously with the isolating region 20.

As shown, the emitter region 23 is in contact with the high density surface of the diffused base region 15 and is enclosed by the substantially homogeneous low conductivity region 21. This novel construction permits variation of the emitter-base junction density without substantially altering the base width or total base density. This is in contrast to the prior art where any variation in junction density alters base width and total base density.

Thus, in the embodiment described, the total base density and base width are essentially determined, in a novel manner, by the width and impurity density of region 15 and not by the density or penetration of the emitter. This follows from the fact that the emitter, in the described embodiment, is formed in a homogeneous base region of low conductivity and not in a diffused base region. Since the base contact region 21 is a substantially homogeneous region of low impurity concentration, it adds little to total base density or width and determines only the minimum emitter-base junction impurity density which may be achieved.

Thus, for example, a minimum junction density may be formed by allowing only a shallow penetration of the emitter 23 so that the emitter-base junction is formed by the emitter 23 and the homogeneous region 21. In this way a depletion region, not shown, is permitted between the emitter 23 and base 15. Devices of this type are suitable in the micropower range; however, at large current values it is desirable to extend the emitter 23 to base region 15, so as to reduce base width widening, base conductivity modulation, and associated reductions in current gain.

Figure 6:
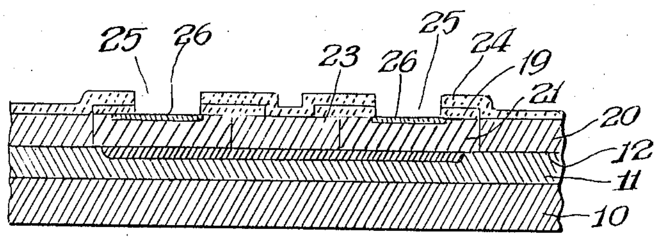
Figure 7:
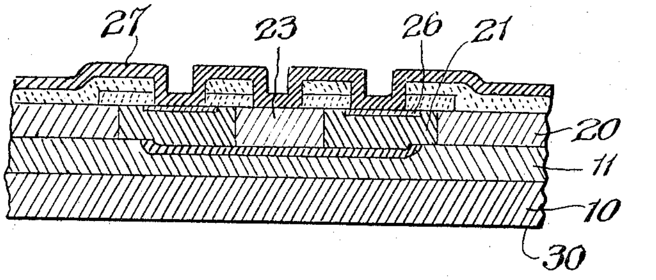

As shown in FIGURE 6, the transistor is prepared for lead attachment by providing a further oxide coat 24 with suitable opening 25. Thereafter a shallow N-type region 26 of high conductivity is diffused in the base contact region 21 to facilitate the making of a low resistance contact. The openng 25 and diffused region 26 may be made in the form of a circle, or any portion thereof, to provide a sufficient contact area. Such contact region 26, may also be provided before diffusion of the emitter.

A further opening is etched in the coating to expose the emitter surface and a metal coating 27 of aluminum, or gold, or the like, is deposited over the structure as shown in FIGURE 6. The coating 27, is provided by plating, vapor deposition, or other suitable means, over the entire upper surface to make contact with the exposed low resistance region 26 and emitter region 23.

Figure 8:
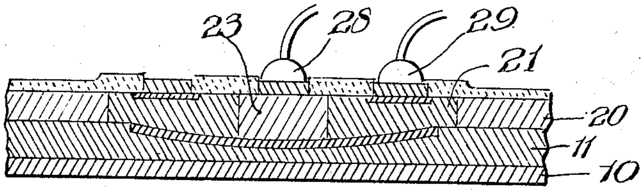
FIGURE 8 is a view in section of a transistor produced in accordance with this invention.

The transistor connections are provided, as shown in FIGURE 8, by suitable means such as by etching the metal coat 27 to leave a metal deposit only on the emitter 23 and base region 26. Thereafter terminals 28 and 29 are attached to these regions. A low resistance connection is provided by suitable means, such as diffusion bonding, soldering, or the like.

Finally, the collector resistance is decreased by reducing the thickness of the collector wafer 10 by any suitable means. For example, the exposed surface 30 of the collector is ground away, as shown in FIGURE 8, to leave a thin collector slice sufficient to provide mechanical support for the structure.

Figure 9:
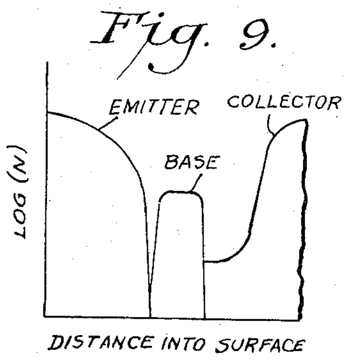
FIGURE 9 is graph depicting impurity distribution through the emitter of a typical device made in accordance with this invention.
Figure 10:
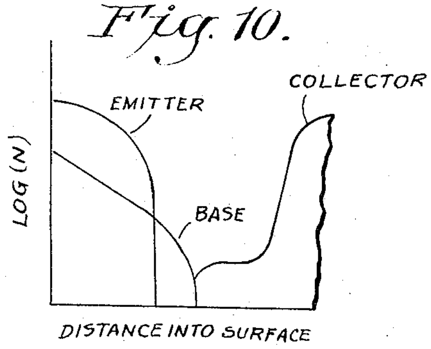
FIGURE 10 is graph depicting impurity distribution of a typical prior art device.

The impurity density profile of a typical device produced in accordance with this invention is shown in FIGURE 9. This profile is taken through the emitter base region to demonstrate the novel characteristics of this portion of the invention. As illustrated the base is a narrow region having low impurity profile intercept with both the emitter region and collector region. It should be noted also that a variation may be made in the emitter-base intercept without essentially altering the base widh or total base density. This is in contrast to the impurity density profile of a conventional diffused base transistor, as shown in FIGURE 10.

From the latter figure, it can be seen that any variation in emitter-base intercept has a large effect on total base density and base width in conventional planar transistors. Thus, as the emitter is allowed to penetrate deeper into the diffused base region, so as to decrease the emitter-base intercept, the base width and base density will also decrease accordingly.

In the above description, the invention has been described in terms of an individual silicon PNP transistor, however, many modifications are possible. For example, an NPN transistor may be fabricated by the described method with appropriate substitution of conductivity type. Other materials such as germanium and intermetallics may also be used. Moreover, the homogeneous contact region may be isolated by other means, such as by etching away the periphery of the layer rather than by diffusion of the appropriate impurity. In addition, it should also be obvious to one skilled in the art, that the described devices may be formed in a large substrate and later diced up to provide individual devices as shown. Furthermore, satisfactory high frequency dual emitter devices may be also fabricated, in the described manner, by, for example, diffusing two emitter regions within the homogeneous region and attaching appropriate contacts to each.

Figure 11:
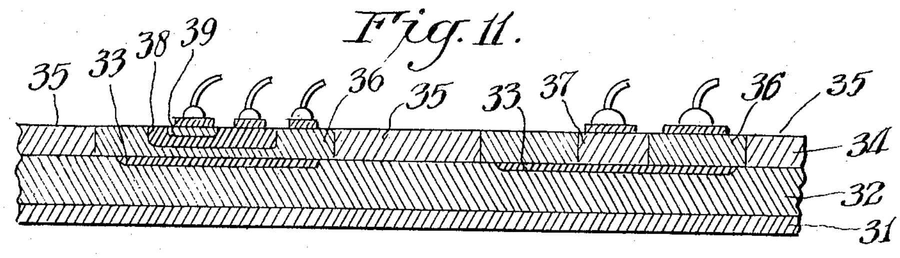
FIGURE 11 is a view in section of a microcircuit device made in accordance with this invention.

Advantageously, the novel concept of the described invention also provides for construction of a microcircuit in which complementary devices formed in the same substrate may be provided with both truly complementary and highly desirable characteristics. This is illustrated in FIGURE 11 wherein a P-type silicon substrate 31 is shown with overlying semiconductor layers 32 and 34.

The substrate 31 and overlying silicon layer 32 are formed with high and low P-type conductivity respectively, in the manner described for the individual transistor above. Thereafter, heavily doped N-type regions 33 are spaced apart in the first layer 32 near its upper surface. These are accomplished by diffusion, or the like, as previously indicated. A further layer 34 of low N-type conductivity is grown overlying the layer 32. Isolating regions 35 of high P-type conductivity are then formed in layer 34 to enclose substantially homogeneous regions 36 adjacent each spaced apart region 33 and extending beyond their periphery.

A high conductivity P-type region 37 is then formed by diffusion or the like in one of the homogeneous regions 36 to form the emitter of a PNP device. Up to this point each step is similar to that described for the individual transistor. The formation of the complementary NPN device is, however, accomplished in the more conventional manner.

Thus, once the PNP device is completed, as described, a region 38 of P-type conductivity is formed in the remaining homogeneous region 36. This may be formed by suitable means such as diffusion or the like. A suitable surface impurity level of $10^{18}$ atoms/cm.$^3$ is desirable, since this region 38 is the base of the NPN device. Finally, a high N-type region 39 is formed in region 38, by diffusion or the like, to provide an emitter region for the NPN transistor.

Metallizing is deposited at appropriate points and leads attached as shown to complete the device. The devices could, of course, be connected by other means such as by allowing the metallized areas to extend to other circuits formed in the same substrate.

The characteristics of the PNP device can, in accordance with the invention, be adjusted to provide a base width, total base density and emitter-base junction density complementary to these characteristics in the NPN device.

It should be noted that the homogeneous region 36 and spaced apart regions 33 provide the base regions of the PNP devices whereas similar regions make up the collector of the NPN device. In the latter case, the heavily doped region 33 is utilized to lower the resistance of its collector.

Although the present device has been described in terms of a P-type substrate 31, a P-type layer 32, and N-type layer 34 etc., it should be understood that the device could also be fabricated with an N-type substrate and with appropriate substitution of conductivity type throughout. Other semiconductive materials etc. could be utilized and isolation could be accomplished by etching or the like.

Furthermore, it should be understood that many modifications of this invention may be made without departing from the spirit and scope thereof and that the invention is not to be limited except as defined in the appended claims.

What is claimed is:

1. A transistor comprising a collector of one conductivity type, a base of the other conductivity type forming a P-N junction with said collector, said base having a narrow region of substantially high conductivity and a region of low conductivity, said narrow region contiguous with said collector, and at least one emitter of said one conductivity type disposed within said low conductivity base region and adjacent to said narrow region, and said narrow region being disposed between said emitter and said collector such that said narrow region substantially determines the base width and base density of said transistor device.

2. The transistor of claim 1 wherein said base region overlies said collector, and said high conductivity narrow region is a lower region, and said low conductivity region is an upper region, and said emitter is disposed within said upper region overlying and contacting said lower region.

3. A transistor comprising a collector of one conductivity type, a base of the other conductivity type overlying said collector and forming a P-N junction therewith, said base having a lower region of high conductivity and a substantially homogeneous upper region of low conductivity, said lower region contiguous with said collector, said homogeneous region extending beyond the periphery of said narrow region and contiguous with said collector therearound, an isolating region having high conductivity of said one conductivity type enclosing the permieter of said homogeneous region and contiguous therewith, and at least one emitter of said one conductivity type being disposed within said homogeneous region and overlying said lower region.

4. A transistor as claimed in claim 3 wherein said one conductivity type is P-type and said other conductivity type is N-type.

5. The transistor of claim 3 wherein said emitter region is contiguous with said lower base region to provide a high density emitter-base junction therebetween.

6. The transistor of claim 5 including a wafer and first and second layers overlying said wafer, said wafer and said first layer having high and low conductivity respectively of said one conductivity type and providing said collector, said lower base region being a narrow region disposed within said first layer at the upper surface thereof, and said homogeneous region being a portion of said second layer enclosed by said isolating region which extends from said first layer to the upper surface of said second layer.

7. A microcircuit device comprising a semiconductor body of one conductivity type, at least two narrow spaced apart regions having high conductivity of the other conductivity type disposed within said body, a substantially homogeneous region having low conductivity of the other conductivity type overlying each of said spaced apart regions and extending beyond the periphery thereof, one of said narrow regions providing a high density base region of a first transistor and another of said narrow regions providing a high density collector region of a second transistor which is complementary to said first transistor, a zone of said one conductivity type being disposed within each of said homogeneous regions, a first of said zones providing an emitter of said first transistor and a second of said zones providing a base of said second transistor, and an emitter region of said other conductivity type being disposed within said second zone and a portion of said body being disposed between said homogeneous regions and contiguous with the perimeter thereof to isolate said transistors from one another.

8. The transistor of claim 7 wherein said first zone is contiguous with said one narrow region to provide a high density emitter-base junction intercept therebetween.

9. The device of claim 8 wherein said body includes a wafer and a first and second overlying layers, said wafer and said first layer having high and low conductivity respectively of said one conductivity type which provide a collector of said first transistor, said narrow spaced apart regions being disposed within said first layer at the upper surface thereof, said homogeneous regions being disposed in said second layer overlying said narrow regions, and said isolating portion of said body being regions of high conductivity disposed within said second layer and extending from said collector to the upper surface of said second layer.

10. A microcircuit device as claimed in claim 9 wherein said one conductivity type is P-type and said other conductivity type is N-type.

11. A method of making a transistor comprising the steps of forming a collector of one conductivity type, forming a narrow base region having high conductivity of the other conductivity type within said collector adjoining the upper surface thereof, forming a substantially homogeneous base region having low conductivity of said other conductivity type overlying said narrow region, and forming an emitter region within said homogeneous region.

12. A method of making a transistor comprising the steps of forming a collector of one conductivity type, forming a narrow base region having high conductivity of said other conductivity type adjoining the upper surface of said collector, forming a substantially homogeneous base region having low conductivity of said other conductivity type overlying said narrow region and extending beyond the periphery thereof, forming an emitter region within said homogeneous region, and forming an isolating region having high conductivity of said one conductivity type extending from said collector to the upper surface of homogeneous region and contiguous with the perimeter thereof.

13. A method of making a transistor comprising the steps of forming a collector wafer of semiconductive material having high conductivity of one conductivity type, forming a first semiconductive layer having low conductivity of said one conductivity type overlying said wafer, forming a narrow base region having high conductivity of the other conductivity type within said first layer at the upper surface thereof, forming a second semiconductive layer having low conductivity of said other conductivity type overlying said first layer, forming an isolating region having high conductivity of said one conductivity type within said second layer at the periphery thereof to enclose a substantially homogeneous region of said second layer overlying said narrow region and extending beyond the periphery thereof, and forming an emitter region having high conductivity of said one conductivity type within said homogeneous region.

14. A method of making a transistor comprising the steps of forming a semiconductor collector wafer having high conductivity of one conductivity type, epitaxially growing a first semiconductor layer having low conductivity of said one conductivity type overlying said wafer, diffusing a narrow base region having high conductivity of the other conductivity type within said first layer at the upper surface thereof, epitaxially growing a second semiconductor layer having low conductivity of said other conducitvity type overlying said first layer, diffusing an isolating region having high conductivity of said one conductivity type within said second layer at the periphery thereof to enclose a substantially homogeneous region of said second layer overlying said narrow region and extending beyond the periphery thereof, and diffusing an emitter region having high conductivity of said one conductivity type within said homogeneous region and extending to said narrow region.

15. A method of making a microcircuit device comprising the steps of forming a semiconductive body of one conductivity type, forming a plurality of spaced apart regions of the other conductivity type within said body, forming a plurality of substantially homogeneous regions having low conductivity of the other conductivity type overlying each of said spaced apart regions and extending beyond the periphery thereof, forming a zone of said one conductivity type within each of said homogeneous regions, and forming a portion of said other conductivity type within one of said zones.

16. A method of making a microcircuit device comprising the steps of forming a semiconductive substrate having high conductivity of one conductivity type, forming a first semiconductive layer having low conductivity of said one conductivity type overlying said substrate, forming a plurality of spaced apart regions of the other conductivity type within said first layer, forming a second semiconductive layer having low conductivity of said other conductivity type overlying said first layer, isolating parts of said second layer to enclose a substantially homogeneous region overlying each spaced apart region and extending beyond the periphery thereof, forming a zone of said one conductivity type within each of said homogeneous regions and forming a portion of said other conductivity type within one of said zones.

17. A method of making a microcircuit device comprising the steps of forming a semiconductive substrate having high conductivity of one conductivity type, epitaxially growing a first semiconductive layer having low conductivity of said one conductivity type overlying said substrate, diffusing a plurality of spaced apart regions having high conductivity of the other conductvity type within said first layer, epitaxially growing a second semiconductive layer having low conductivity of said other conductivity type overlying said first layer, diffusing isolating regions having high conductivity of said one conductivity type within said second layer to enclose a substantially homogeneous region overlying each spaced apart region and extending beyond the periphery thereof, diffusing a zone of said one conductivity type within each of said homogeneous regions, and diffusing a portion of said other conductivity type within one of said zones.

References Cited

UNITED STATES PATENTS

| | | | |
|---|---|---|---|
| 3,197,710 | 7/1965 | Lin | 317—235 |
| 3,260,902 | 7/1966 | Porter | 317—235 |
| 3,305,913 | 2/1967 | Loro | 29—25.3 |
| 3,325,707 | 6/1967 | Gilbert | 317—235 |
| 3,327,182 | 6/1967 | Kisinski | 317—235 |

FOREIGN PATENTS

| | | |
|---|---|---|
| 916,346 | 1/1963 | Great Britain. |

OTHER REFERENCES

Article by R. H. Van Ligten, I.B.M. Technical Disclosure Bulletin, vol. 4, No. 10, March 1962, pp. 58, 59.

JOHN W. HUCKERT, *Primary Examiner.*

R. F. POLISSACK, *Assistant Examiner.*

U.S. Cl. X.R.

317—234; 29—576, 577